(12) United States Patent
Cheung

(10) Patent No.: US 6,466,444 B2
(45) Date of Patent: Oct. 15, 2002

(54) HEAT SINK

(75) Inventor: Wai Kwan Cheung, Hong Kong (CN)

(73) Assignee: Yunk Woon Cheung, Hong Kong (CN)

( * ) Notice: Subject to any disclaimer, the term of this patent is extended or adjusted under 35 U.S.C. 154(b) by 0 days.

(21) Appl. No.: 09/852,605

(22) Filed: May 10, 2001

(65) Prior Publication Data

US 2001/0055199 A1 Dec. 27, 2001

(30) Foreign Application Priority Data

May 10, 2000 (CN) .......................................... 00108285 A

(51) Int. Cl.$^7$ ................................................. H05K 7/20

(52) U.S. Cl. ...................... 361/703; 165/86.3; 165/185; 174/16.3; 257/722; 361/709; 361/690

(58) Field of Search ............................... 165/80.2, 80.3, 165/185, 121–125; 174/16.3; 257/706–707, 712–713, 722; 361/687–688, 690, 694–697, 704, 707, 709–710; 415/176–178

(56) References Cited

U.S. PATENT DOCUMENTS 5,740,014 A * 4/1998 Lin .............................. 361/697
6,179,046 B1 * 1/2001 Hwang et al. ............. 165/80.3
6,301,110 B1 * 10/2001 Kodaira ....................... 361/697

* cited by examiner

*Primary Examiner*—Gregory Thompson
(74) *Attorney, Agent, or Firm*—Fish & Richardson P.C.

(57) ABSTRACT

A heat sink including a first and a second group of heat dissipating members integrally formed and extending upwardly from a base portion. The first group of heat dissipation members includes a plurality of fin-shaped members each having main heat dissipation surfaces surrounded by thin peripheral edges including a top edge, an inside edge and an outside edge. The thin peripheral top edges generally extend from the interior of the base portion towards the outside periphery of the base portion. The main heat dissipation surfaces on adjacent heat dissipation members are substantially opposing to each other, and the second group of heat dissipation members is disposed between the first group of heat dissipation members and the center of the base portion.

12 Claims, 10 Drawing Sheets

HEAT SINK

FIELD OF THE INVENTION

The present invention relates to heat sinks and, more particularly, to heat sinks or cooling devices for cooling down an electronic device. More specifically, although not necessarily solely, the present invention relates to a heat sink for a microprocessor or a central processing unit (CPU) and, more particularly, to a very high speed CPU device.

BACKGROUND OF THE INVENTION

Heat sinks are generally used to transfer heat away from a device in order to prevent overheating of the device which may result in instantaneous or premature failure of the device. In the past, heat sinks are mainly important for power devices, such as power amplifiers, rectifiers or other power electronic devices, and are seldomly of concern to the traditional "low-powered" devices such as microprocessors or CPUs for computers, especially micro- or personal computers.

However, with the rapid advancement of microelectronics in the last decades coupled with the rush by component manufacturers to compete by squeezing an ever increasing number of circuitries on a single IC chip, integrated circuits (IC), and particularly microprocessors or CPUs, become more and more highly integrated with the separation between adjacent circuitries within a single IC chip becoming less and less. Such a rush for an ever higher integration density of circuitries on a single chip is especially phenomenal among microprocessor manufacturers who are under constant pressure to provide an increased number of features, and therefore component circuitries, on a single chip to attract consumers. At the same time, microprocessor manufacturers are also racing to turn out microprocessors having very high operating clock rates. In fact, microprocessors having clock rates of 1.7 GHz are available and the clock rates are still expected to increase further.

However, with the ultra high density of circuit integration together with the high operating clock rates, the heat generated by a single microprocessor becomes an important issue. Appropriate instantaneous cooling must be provided to remove undesirable heat from the microprocessor in order to prevent accumulation of the undesirable heat and to ensure that the microprocessor works below the maximum permissible temperature. Adequate cooling is necessary to ensure device reliability as well as protecting the device from sudden or premature failure or interruption. Metallic heat sinks which are thermally coupled to a microprocessor are usually used to dissipated the undesirable heat from the microprocessors.

Conventional heat sinks are either of the integral or the non-integral type. The non-integral type of heat sinks consists primarily of a number of discrete components which are assembled together by, for example, welding, fastening or riveting to form a complete heat sink. Such heat sinks are inefficient or unreliable because of the imperfect junction between the discrete components. Heat sinks of the integral type are usually formed and manufactured from a billet by either hot extrusion, forging, die casting, cutting or milling. Among these methods, the minimum thickness of heat dissipating fins is said to be about 1.5 mm for heat sinks formed by milling. The lower limit for all practical purposes of the gaps between adjacent fins is said to be about 2 mm while the height of the fins cannot exceed 10 times the gap. With these practical limitations, milled heat sinks are not suitable for use with state-of-the-art microprocessors. On the other hand, heat sinks formed by cutting and die casting have such poor production efficiency that it is not economically feasible to adopt them in large-scale industrial production. While heat sinks made by hot extrusion are relatively inexpensive, it is however well known that the thickness and pitch of the fins are inherently limited such that the heat dissipating characteristics of such heat sinks are unsatisfactory.

In general, the performance of a solid state heat sink is measured by the heat dissipation area which can be provided in a given envelope volume as well as the efficiency or easiness of the flow of cooling air across the heat dissipating members. The heat dissipating area per unit volume can be increased by reducing the thickness of the heat dissipating members while the easiness of flow of cooling air across the heat dissipating members can be improved by careful arrangement or alignment of the heat dissipating members in order to reduce the resistance to the flow of cooling air. Hence, it is desirable to provide improved solid state heat sinks having an increased heat dissipation area per given envelope volume of the heat sink with heat dissipation members arranged in a manner which will be less resistant to the flow of cooling air across the heat dissipation members.

A usual approach to increase the flow of cooling air across the heat dissipating members of a heat sink is by using electric fans which are mounted adjacent to a microprocessor to cause forced convection of cooling air streams. While an electric fan is sometimes effective to increase the thermal dissipating rate, over-reliance on an electric fan can be dangerous as an electric fan is known to be noisy and have a limited operation life and reliability. Any interruption of the fan may cause interruption or damage to the microprocessor which can be annoying and is undesirable. Furthermore, the use of an electric fan also increases the power requirements of the computer as a whole and is undesirable for lap-top or pocket computers. Hence, a highly efficient heat sink particularly suitable for microprocessors which will reduce, obviate or even eliminate the reliance on electric fans to ensure adequate heat dissipation is highly desirable. Accordingly, it is desirable to provide a highly efficient solid state heat sink so that sufficient heat dissipation from a high speed microprocessor can be achieved through the heat sink without relying on an electric fan, or alternatively, an electric fan is only used as a standby cooling device or for contingence only.

OBJECTS OF THE INVENTION

It is therefore an object of the present invention to provide a heat sink with an enhanced heat dissipation capability. In general, the preferred heat sink will have an enhanced heat dissipation area per given envelope volume and the heat dissipation members are arranged in a manner which are less resistant to the flow of cooling air. It is also an object of the present invention to provide a heat sink having highly efficient heat dissipation characteristics by obviating the drawbacks associated with non-integrally formed heat sinks. It is another object of the present invention to provide an integrally formed heat sink made by cold forging an appropriate heat conducting material which provides a very satisfactory heat dissipation characteristic. It is a further object of the present invention to provide a heat sink formed of a preferred alloy which demonstrates improved thermal dissipation characteristics after subjecting to formation by a cold forging process.

SUMMARY OF THE INVENTION

According to a first aspect of the present invention, there is provided a heat sink including a base portion, said base portion includes a first surface for thermally coupling said heat sink with an electronic device, and a second surface on which a first and a second group of heat dissipating members are integrally formed and extend upwardly therefrom; said first group of heat dissipation members includes a plurality of fin-shaped members each having main heat dissipation surfaces surrounded by thin peripheral edges including a top edge, an inside edge and an outside edge, said thin peripheral top edges generally extend from the interior of said base portion towards the outside periphery of said base portion, said main heat dissipation surfaces on adjacent heat dissipation members are substantially opposing to each other, and said second group of heat dissipation members are disposed between said first group of heat dissipation members and the centre of said base portion.

Preferably, said second group of heat dissipation members includes a plurality of fin-shaped members.

Preferably, said second group fin-shaped members includes main heat dissipation surfaces interconnected by a thin peripheral top edge, said peripheral edge extends generally from said centre to the exterior of said base portion.

Preferably, said second group heat dissipating members includes fin-shaped members which are shorter than that of the first group members.

Preferably, said second group of heat dissipating members is disposed adjacent to said first group so that said second group is kept at a distance away from said inside thin edges of said first group heat dissipation members.

According to a second aspect of the present invention, there is provided a heat sink including a base portion, said base portion includes a neck portion and a shoulder portion, said shoulder portion abuts said neck portion and has a substantially larger cross-sectional area than said base portion wherein a plurality of heat dissipating heat members are integrally formed along the periphery of said shoulder portion so that said fin members are substantially overhanging said shoulder portion with space between adjacent fin members substantially unobstructed.

Preferably, said shoulder portion is adapted to extend beyond the package of said electronic device.

BRIEF DESCRIPTION OF THE PREFERRED EMBODIMENTS

Preferred embodiments of the present invention will be explained by way of examples and with reference to the accompanying drawings, in which.

DETAILED DESCRIPTION OF THE PREFERRED EMBODIMENTS

Figure 1:
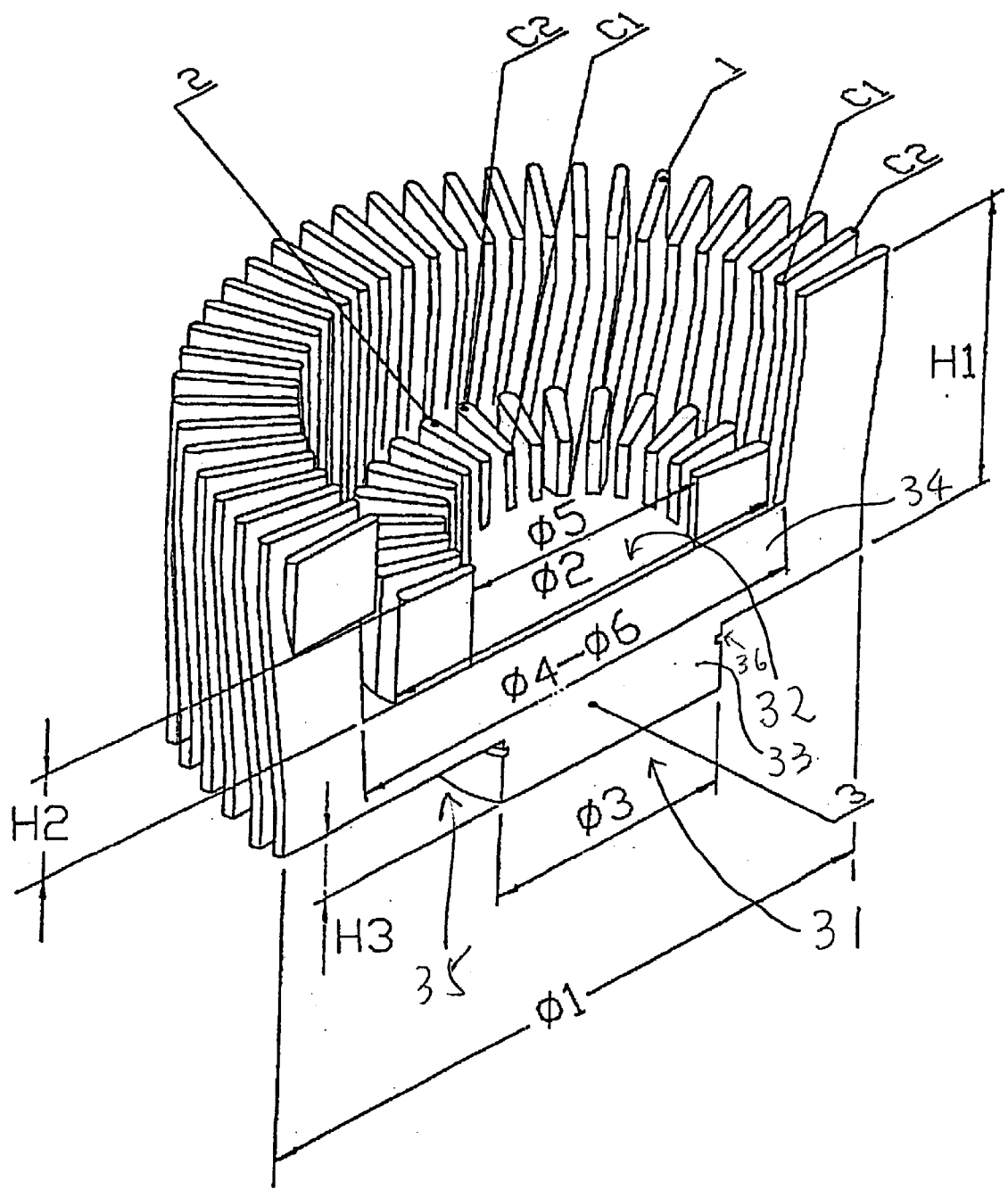
FIG. 1 is a perspective view of a first preferred embodiment of the heat sink of the present invention when viewed from the top (base portion being hidden)
Figure 2:
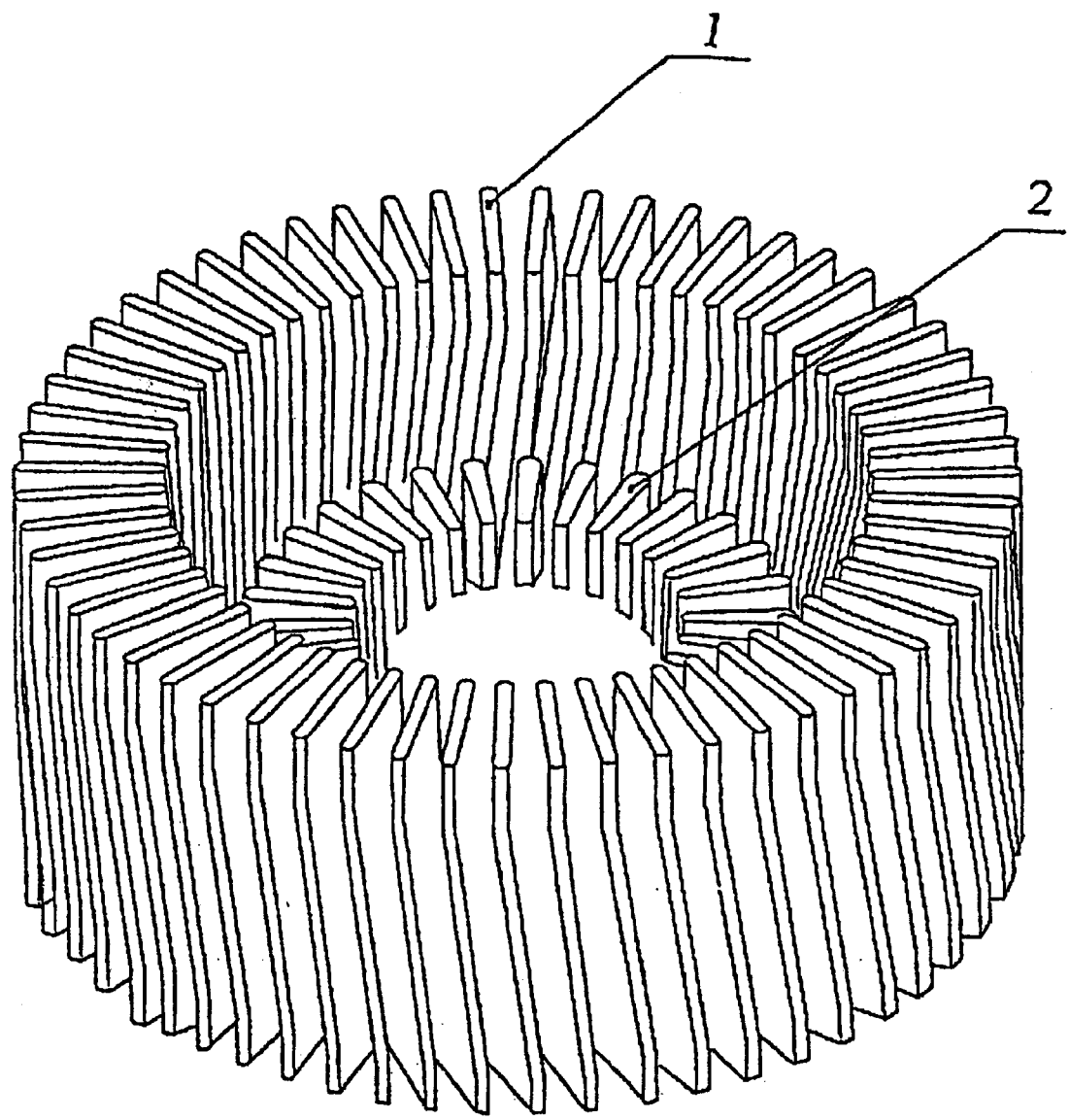
FIG. 2 is a perspective view showing the heat sink of FIG. 1 with part of the heat sink cut away at about the middle.
Figure 3:
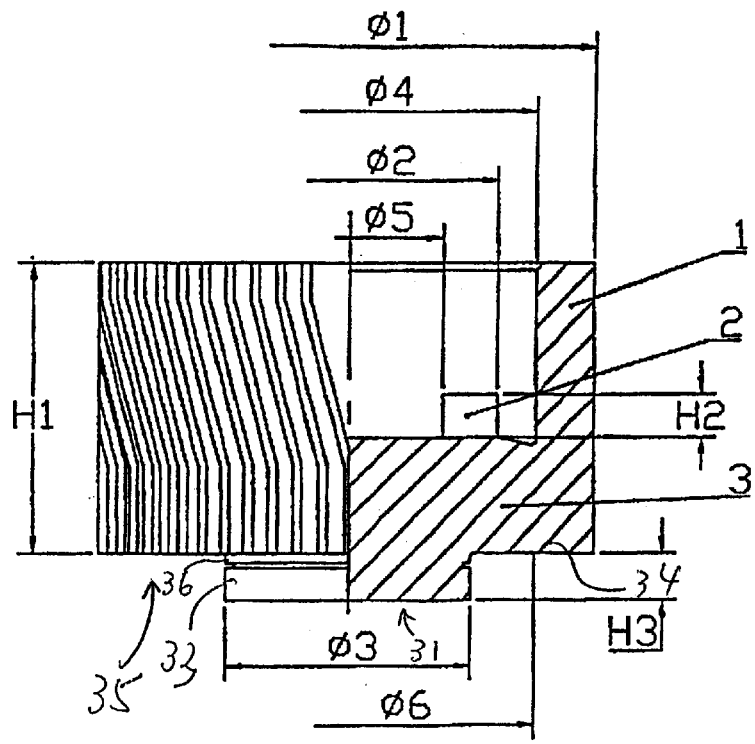
FIG. 3 is a side view of the heat sink of FIG. 1 with the rightof the figure showing the cross-section of the heat sink.
Figure 4:
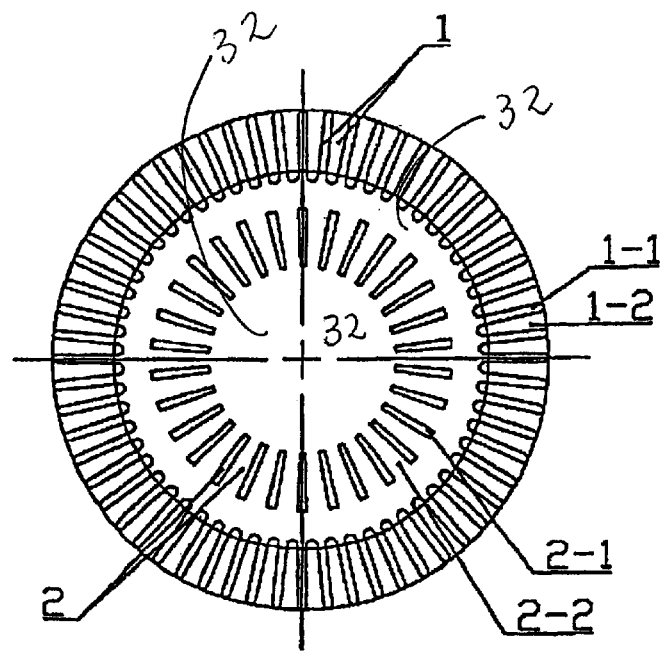
FIG. 4 is a plan view of the heat sink of FIG. 1 when viewed from above.
Figure 5:
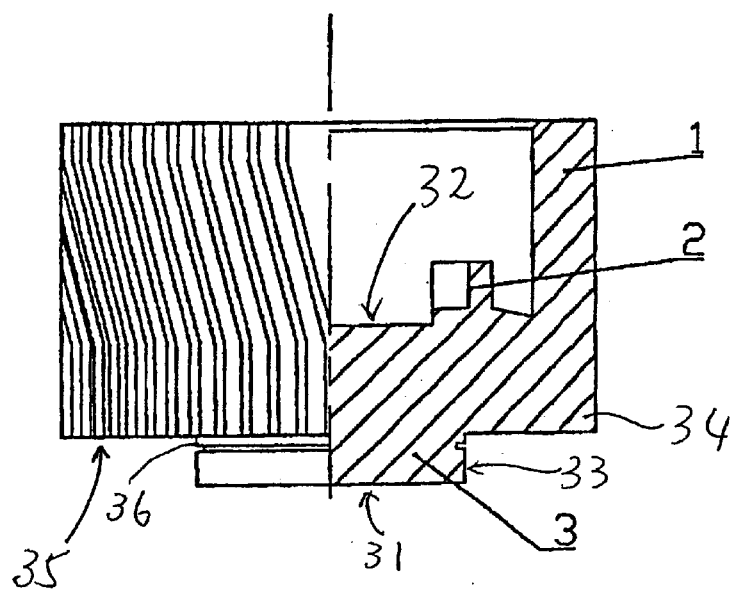
FIG. 5 is a side view of a second preferred embodiment of the present invention with the right side of the figure showing a cross-sectional view of the heat sink.
Figure 6:
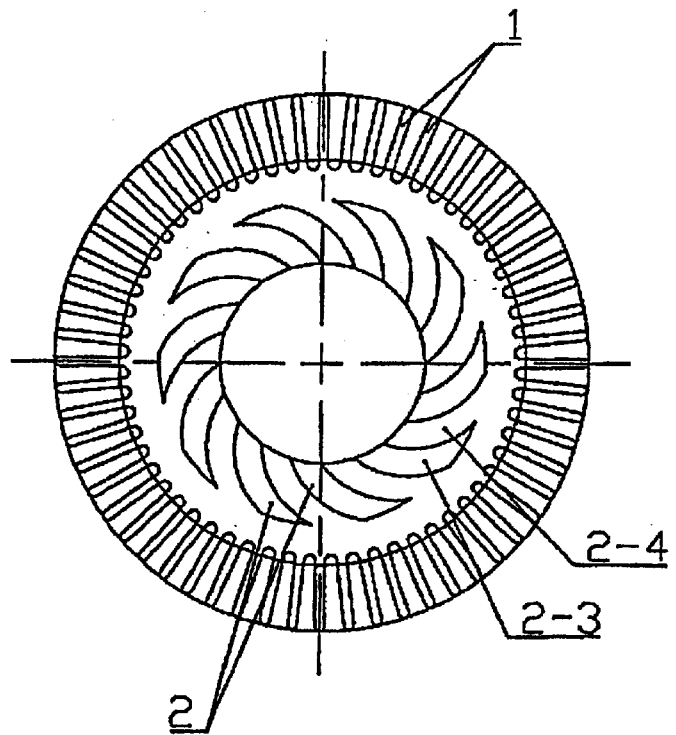
FIG. 6 is a plan view of the second preferred embodiment when viewed from above.
Figure 7:
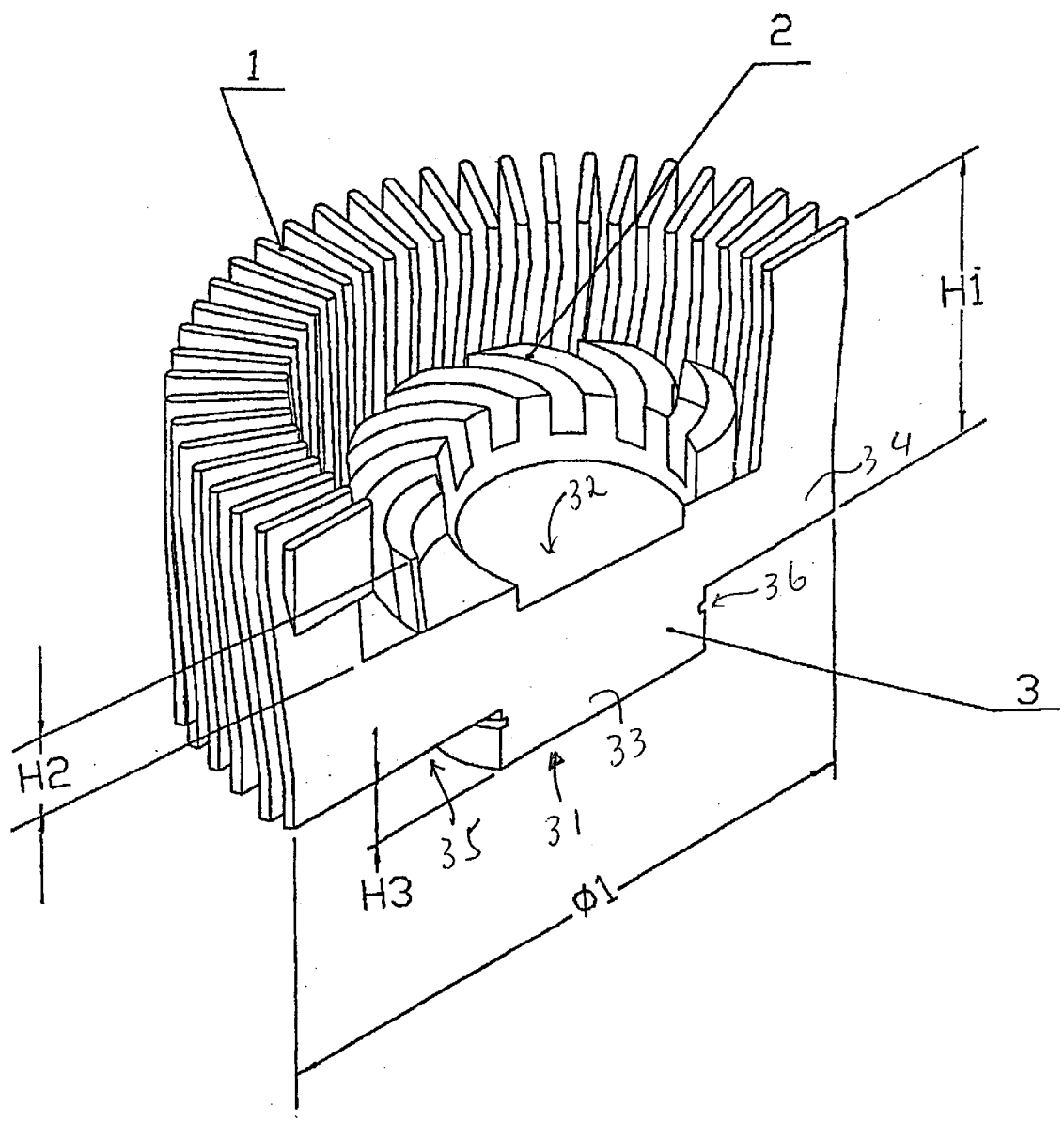
FIG. 7 is a top perspective view of the embodiment of FIG. 5 with part of the heat sink cut away at about the middle.
Figure 8:
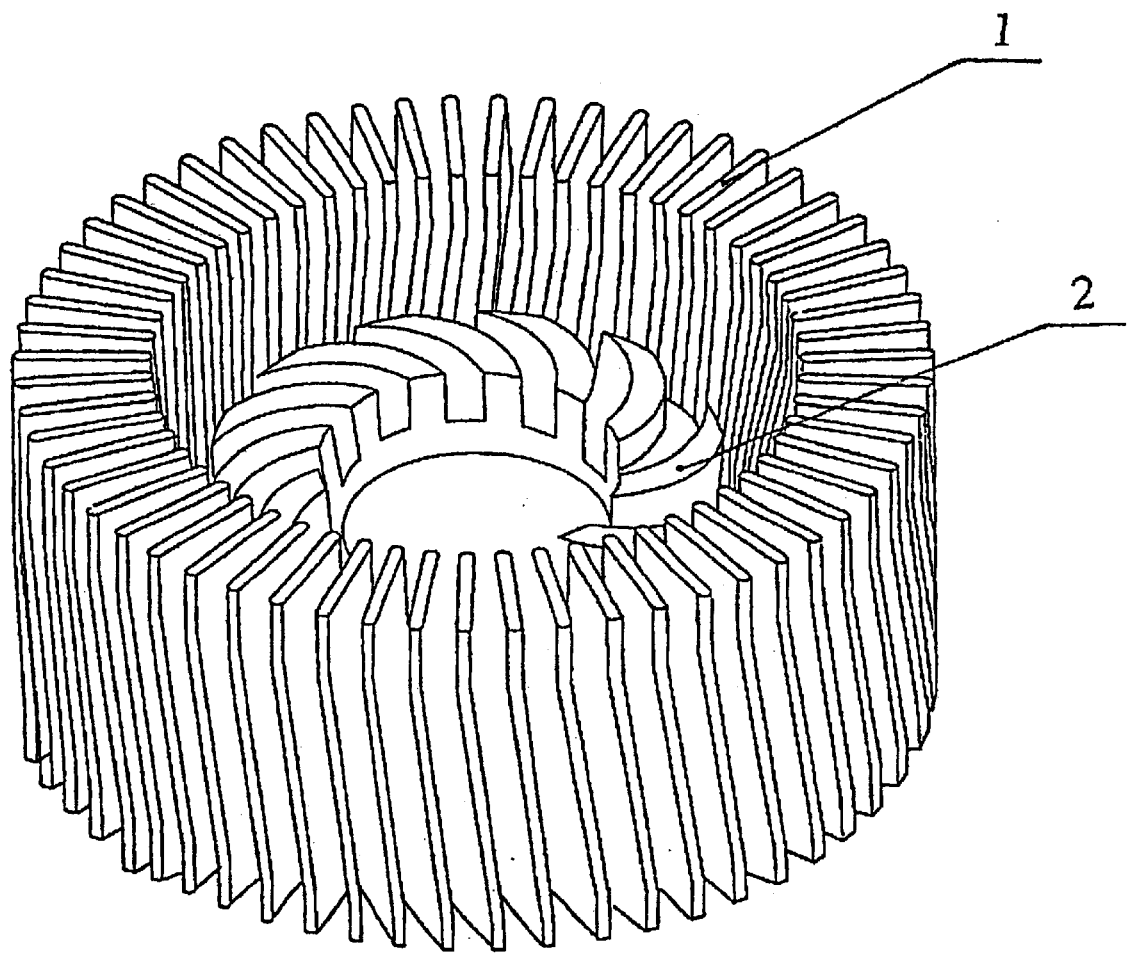
FIG. 8 is a perspective view of the embodiment of FIG. 5.

Referring to FIGS. 1–4, there is shown a first preferred embodiment of the heat sink of the present invention. The heat sink includes a solid base portion (3) having a thermal coupling surface on one side (a lower surface) (31) and a plurality of heat dissipation members extending substantially upwardly from the other side (32) (the top side). The solid base (3) includes a neck portion (33) and a shoulder portion (34). The neck portion (33) is generally solid and cylindrical and has a lower surface (31) for making direct thermal coupling with the heat generating surface of an electronic device such as a microprocessor or a CPU (not shown). The lower surface (31) is preferably well polished to form a smooth contact area in order to enhance heat transfer between the electronic device and the heat sink. The cross-sectional dimensions of sectional dimensions of the neck portion (33) are generally designed to conform to the heat generating surface of the electronic device for maximum heat transfer and can be made into various standard shapes to ensure full geometric matching between the contact surfaces.

The upper end of the neck portion adjoins the lower side (35) of the shoulder portion (34) which has an increased cross-sectional dimension (compared to the neck portion) in order to accommodate an adequate plurality of heat dissipation members for an adequate heat dissipation area to ensure efficient heat dissipation from the heat sink. The extended shoulder portion also has the effect of extending the heat dissipation area beyond the heat generating chip. The shoulder portion (34) is also generally cylindrical and can be made into various shapes such as circular, square, rectangular, polygonal or other suitable cross-sectional shapes meeting individual specifications. In general, the cross-sectional dimensions of the shoulder portion are generally limited by the requirements that the complete microprocessor-heat sink assembly has to be sufficiently compact to meet with computer manufacturer specifications and the general consumer's ever increasing demand for the ever down-sizing of computers, whether portable, lap-top or desk top.

At the junction between the neck portion and the shoulder portion, a groove (36) is formed on the periphery for enhancing heating dissipation originating from the second group fin members which are generally disposed on the interior of the heat sink. To enable adequate heat dissipation from the heat sink, a first group (1) of heat dissipation members are disposed along the outside periphery of the shoulder portion. This first group (1) of heat dissipation members preferably include a plurality of fin- or blade-shaped members having main heat dissipation surfaces of a height which is generally designated by H1 in the Figures. The inside and outside heat dissipation surfaces of the heat dissipating fins are generally interconnected by an inside (C1), an outside (C2) and a top thin or narrow edge.

In general, the fin-shaped heat dissipation members (1) should be as thin as possible so that more heat dissipation surfaces can be included in a given envelope volume of a heat sink, although the thickness of the fin should be adequate to ensure that the fins are strong enough to maintain its shape and will not flex as a result of the vibration of the peripheral components in a computer or during transportation. Naturally, the thickness of the fins is also limited by the forming technology employed.

The fin-shaped members are preferably upwardly extending from the shoulder portion and may slightly bend away from the heat sink to increase the footprint of the fin-shaped members to further improve heat dissipation by expanding away from the CPU. Hence, although not necessarily, the fin-shaped members in this specific embodiment has a generally "Z" shape.

To generally improve the flow of cooling air between the bottom and top edges of the fin-shaped members, the space separating the bottom edges of adjacent fin-shaped members is kept free so that cooling air can flow directly from the base of the fin-shaped member towards the top edges or vice versa. In this specific embodiment, the individual fins are only connected to the shoulder portion (34) at the lower end of the inside edges of the first group fin members so that cooling air can flow substantially unobstructed (by the base portion) from the base of the shoulder portion towards the top of the fin members. The plurality of fin-shaped members are preferably evenly distributed along the periphery of the shoulder portion to ensure even heat dissipation. Of course, for electronic device with localized heat generation, the distribution of the heat dissipation members can be adjusted accordingly without loss of generality.

In this specific embodiment, the shoulder portion (34) has a generally circular cross-section and the fin-shaped members are generally distributed in a radial manner. In general, the fin-shaped members are disposed generally along the outside periphery of the shoulder portion (34) so that the thin top edges extend generally from the inside of the shoulder portion towards the exterior. With such a general arrangement, the space separating adjacent fin-shaped members defines a plurality of cooling-air channels which extend between the inside and outside of the heat sink.

To even further improve the flow of cooling-air streams along the channels defined by the main heat dissipation surfaces of adjacent cooling fins, the thickness of the outside edges (C2) of a fin member (1) is made thicker than that of the inside edges (C1) to reduce air resistance and both edges are preferably made with a substantially arcuate shape to reduce air resistance. With this arrangement, cooling air stream can flow in a radial manner between the inside and outside of the heat sink as well as longitudinally between the top and bottom edges of the fin-shaped members, thereby providing a multi-dimensional cooling-air stream to maximise heat dissipation in a given envelope volume. For a shoulder portion having a non-circular periphery, the fins (1) may be generally arranged so that the separation between the outside thin edges of the fins is more than that between adjacent inside thin edges. Of course, the fins may also be arranged so that the fins are generally parallel with the exception of fin members at same positions such as corners which may be arranged in a generally radial or otherwise manner.

In addition to the first group of heat dissipation members described above, there is also provided a second group (2) of heat dissipation members which is integrally formed and upwardly extending from the upper surface of the shoulder portion. This second group of heat dissipation members (2) is generally disposed between the centre of the shoulder portion and the inside edges of the first group fin members. The second group preferably includes a plurality of fin- or blade-shape heat dissipation members which are known to provide a reasonably good heat dissipation area for a given envelope volume. Similar to other fin-shaped members, the second group fin members also includes main heat dissipation surfaces interconnected by an outside, a top and an inside thin edge. To enable cooling air to flow reasonably unobstructed in an radial manner from the centre of the shoulder portion to the outside, the second group fins are generally arranged so that the top thin edges extend generally from the interior of the shoulder portion towards the outside.

In the present specific arrangement, the second group members (2) are generally disposed in an annular member with the top thin edges disposed substantially in a radial manner. Similar to the cross-sectional design of the first group fin members, the thickness of the outside edge of the second group fin members are larger than that of the inside edge and both edges are preferably arcuate to reduce air resistance. Preferably the height of second group fins are less than that of the first group fins.

Also, in the present specific embodiment, the first and the second group of fin members are arranged in concentric circles so that the space separating the first and second group fin members is also annular, thereby forming a ring-shaped separation between the two groups of heat dissipation members.

To improve heat dissipation by reducing resistance to the cooling air flowing from the inside of the shoulder portion to the outside, the second group of fins are preferably made with a height which is substantially less than that of the first group fin members. Also, the inside thin edges of the second group of fin members are preferably arranged along the periphery of the neck portion so that adequate separation between individual fin members can be maintained. On the other hand, the inside thin edges of the first group fin members preferably approximately coincide with the periphery of the shoulder portion.

As the total heat dissipation area is substantially contributed by the first group fin members, it will follow that more heat dissipation area can be provided if more fin members can be fitted into the external ring. This is however subject to adequate space being provided between adjacent fin members so that adequate cooling ventilation can be provided. The same design criteria also apply to the second group of fins (2). However, as the second group of fins are distributed along a ring of smaller circumference, it would be appreciated that, for fins of the same thickness, less number of fins will be integrally formed on an inner ring on the shoulder portion. As an example, there are respectively 60 and 30 fin members for the first and second group. Solely for the purpose of illustration only, some typical parameters of the present specific embodiment are set out below:

| Description | Dimension (mm) |
| --- | --- |
| External diameter of the device (measured between outside thin edges on diametrically opposing fin members) ($\phi 1$) | 69 |
| External dimension measured between the outside thin edges of diametrically opposing second group fin members ($\phi 2$) | 42 |
| Diameter of the neck portion ($\phi 3$) | 34 |
| Distance between inside thin edges of | 52 |

-continued

| Description | Dimension (mm) |
| --- | --- |
| diametrically opposing first group fin members (φ4) | |
| Distance between inside thin edges of second group fin members (φ5) | 26 |
| Diameter of the shoulder portion (φ6) (=φ4) | 52 |
| Height of the first group fin members (H1) | 33.5 |
| Height of typical second group fin members (H2) | 5 |
| Thickness of the neck portion (H3) | 6.5 |
| Thickness of the shoulder portion (H4) | 16.5 |
| Number of first group fins (M) | 60 |
| Number of second group fin members (N) | 30 |
| Thickness of the outside thin edge of the first group fin member (C2) | 1.1 |
| Thickness of the inside thin edge of the first group fin member (C1) | 0.9 |
| Material | aluminium 6063 |

Referring to FIGS. 5–8, there is shown a second preferred embodiment of the present invention. The heat sink of the present embodiment is substantially identical to the first embodiment except that the second group of heat dissipation members are slightly different. In this preferred embodiment, the second group of heat dissipation members are also disposed on the area on which the second group of heat dissipation members are disposed in the first embodiment. However, this second group includes a plurality of spiral shaped fin-shaped members so that each of the fin-shaped members has a concave and a convex heat dissipation surface. When hot air leaves the spiral shaped fin members, there will be an initial whirling due to the fin arrangements which will enhance hot air movements and improve heat exchange with the environment.

While the present invention has been explained with reference to the specific preferred embodiment above, it should be understood that heat dissipation members of various appropriate shapes can be utilised and appropriately distributed on the shoulder portion for effective heat dissipation from an electronic device. In particular, the first and second group of heat dissipation members can be arranged in any appropriate overall configuration, for example, circular, rectangular, square or polygonal. Furthermore, the first and second group of heat dissipation members can be arranged in the same or different configurations, for example, the first group members can be arranged into a rectangular configuration while the second group of internal fin members can be arranged into circular or square configurations. In any event, the present invention has described an improved heat sink having a first and a second group of heat dissipation members which are disposed or distributed on the shoulder portion. The shoulder portion adjoins the neck portion of the heat sink the lower surface of which provides direct thermal coupling between the heat sink and the electronic device. In addition, the present invention can be realised in many different ways using fin members of many different forms or shapes which can be arranged into various configurations without loss of generality and without departing from the scope of the present invention.

Figure 9:
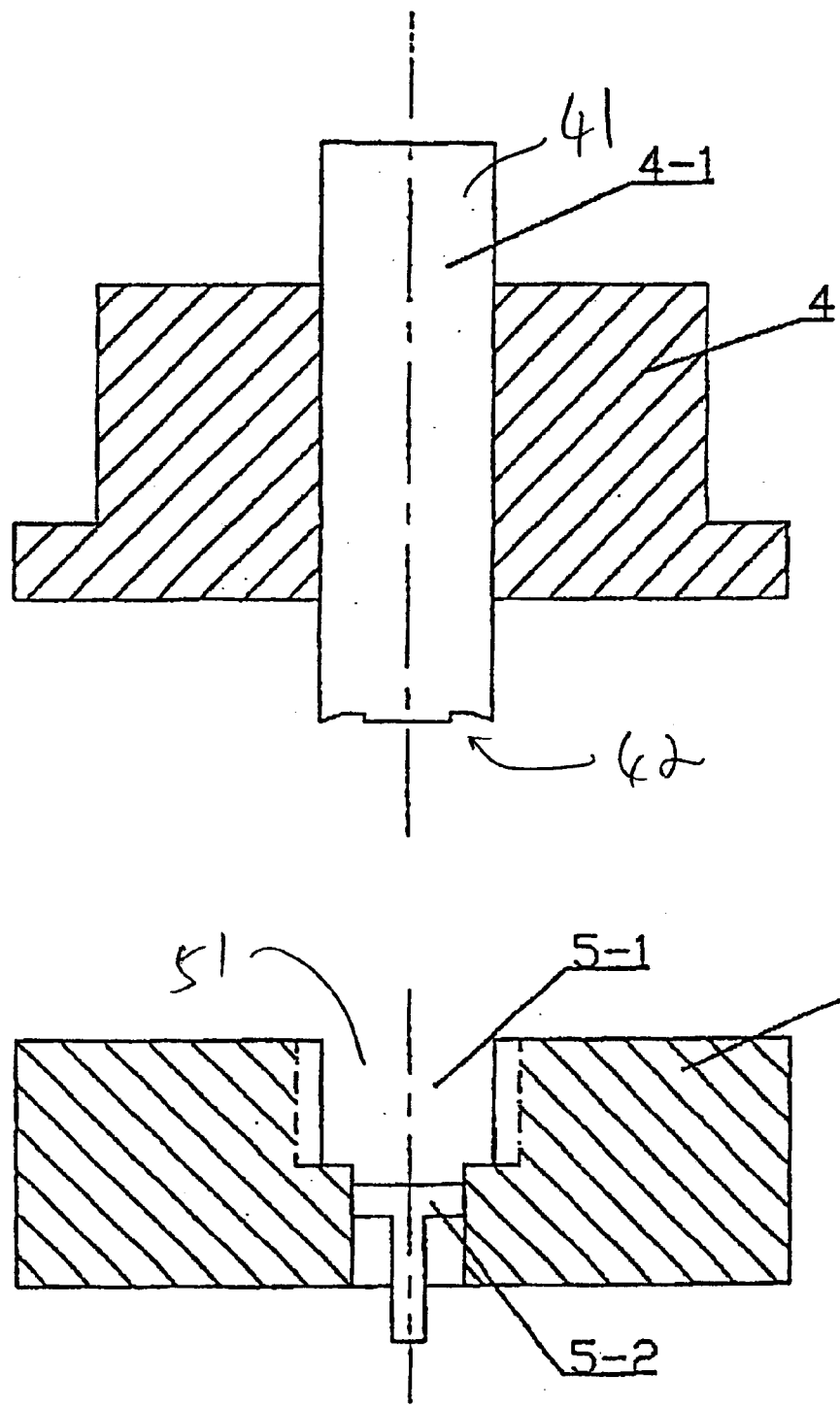
FIG. 9 is a sketch showing an example of an apparatus for forming a heat sink of the present invention by cold forging.

An example of how the present heat sink can be formed by way of cold forging will be explained below with reference to FIGS. 9–12. Cold forging is preferred for forming a heat sink having fin heat dissipation members compared to other known metal device forming methods such as hot extrusion, milling and cutting as explained above. Referring to FIG. 9, there is shown an apparatus for cold forging a heat sink from a metallic or alloy billet. Aluminium 6063 is a preferred starting material as it provides good thermal conductivity as well as strength, ductility, smoothness and other important characteristics for making a good heat sink. Of course, other alloys, including other aluminium alloys, can be used if the materials possess the appropriate characteristics. The cold forging apparatus includes a punch (4) having a plunger (41) carrying an upper mould (42) at its lowest end. The second part of the forging apparatus includes a lower mould (5) having an aperture (51) which substantially defines the exterior shape and configuration of the heat sink. In general, when the upper and lower part of the forging apparatus are coupled together, the space formed between the coupled forging apparatus will correspond to the first and second group of heat dissipation members, the shoulder portion as well as the neck portion of the heat sink. A cushioning piston is fitted within the cavity of the lower mould which corresponds to the neck portion of the heat sink and provides an escape or overflow for the redundant material during the punching or cold forging of the heat sink.

Figure 10:
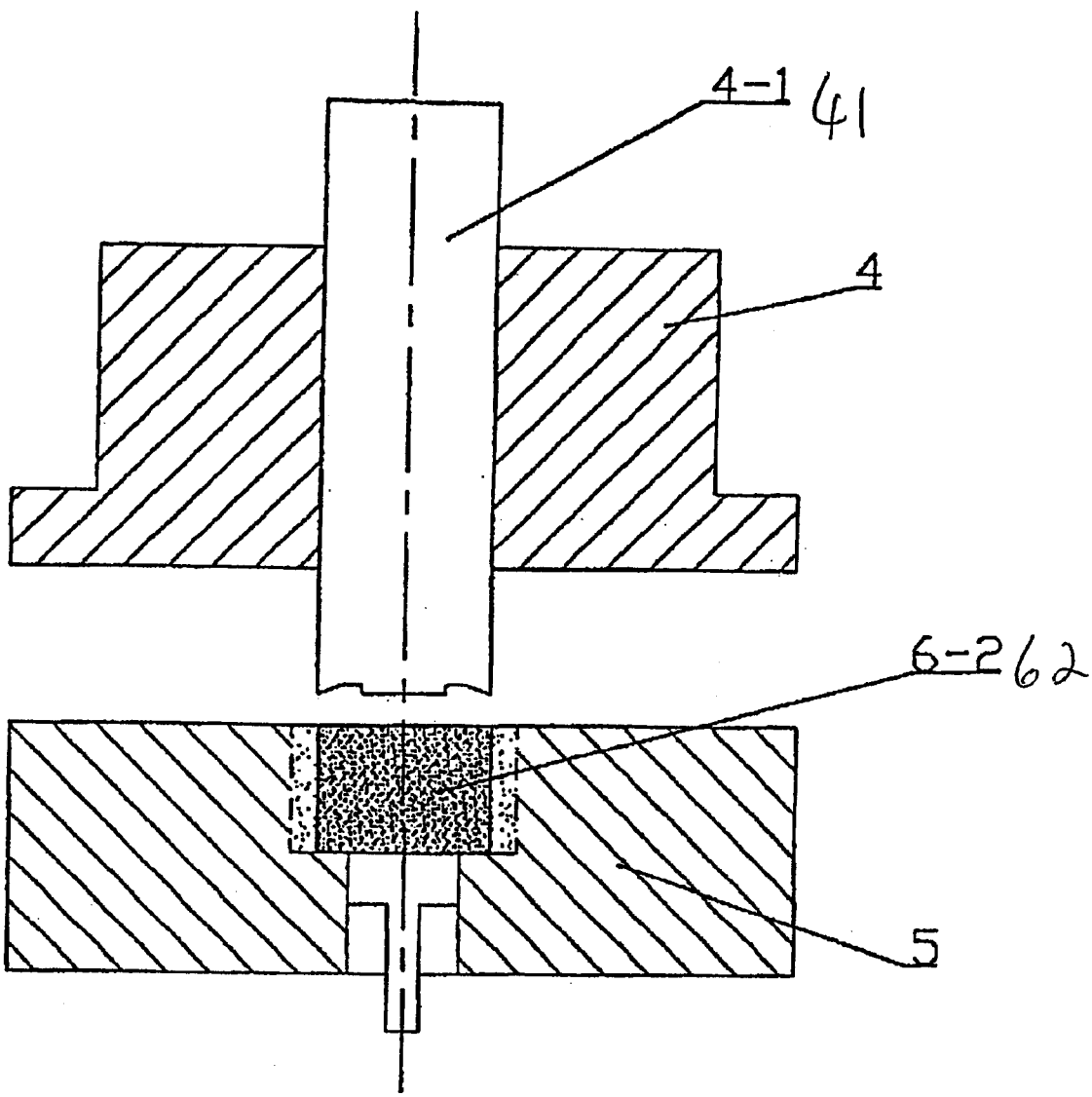
FIG. 10 is a sketch showing the apparatus of FIG. 9 just before cold forging is performed.
Figure 11:
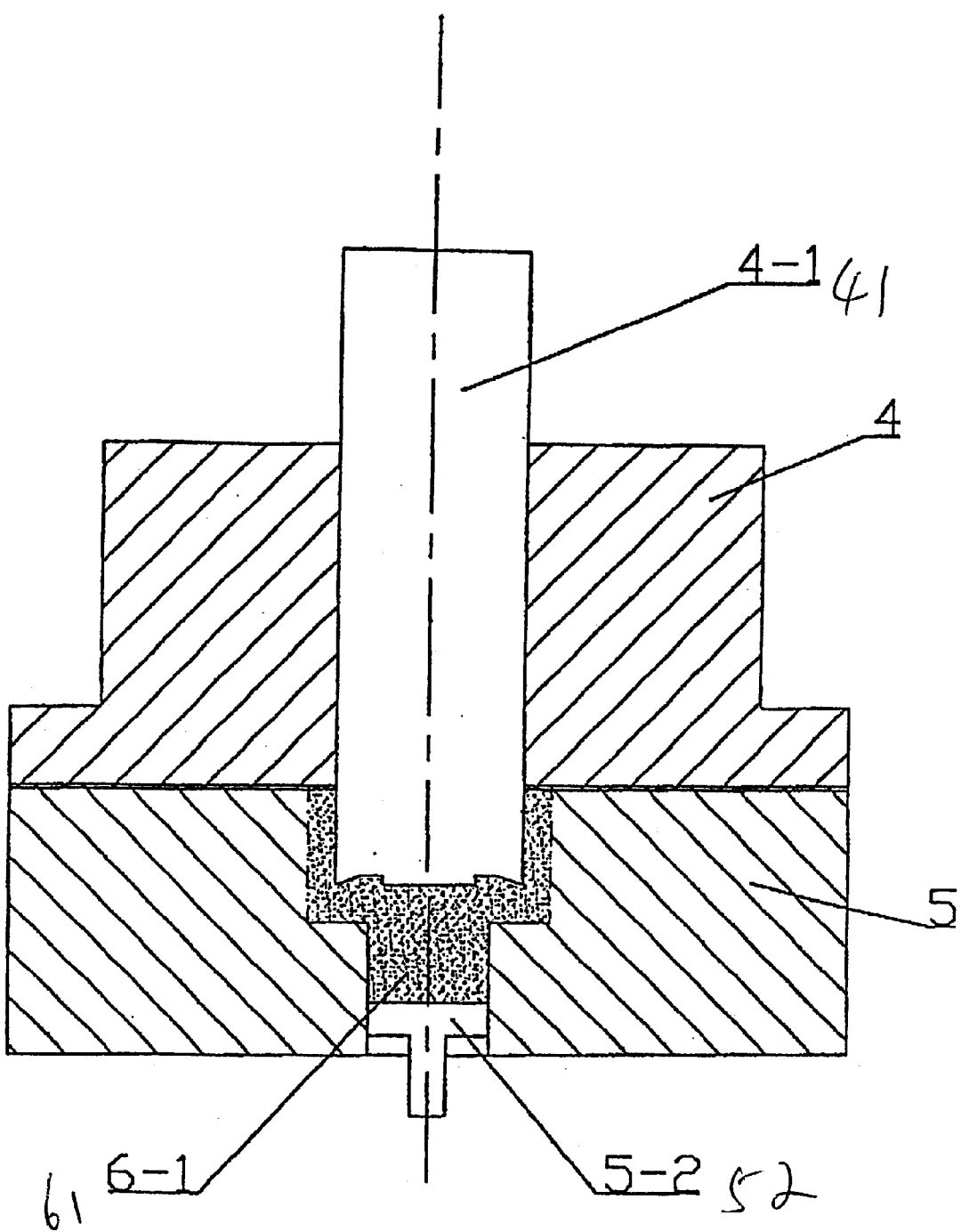
FIG. 11 is a sketch showing how cold forging is performed in the present invention.
Figure 12:
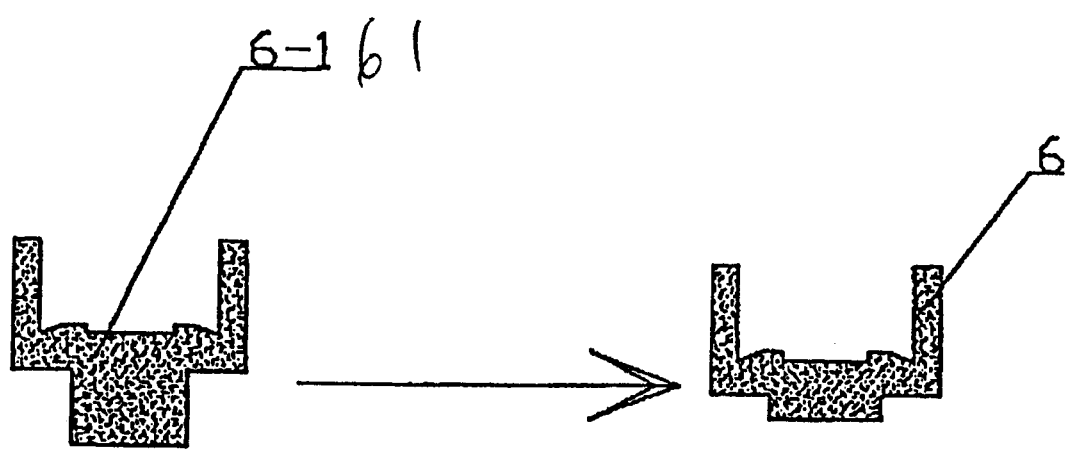
FIG. 12 illustrates a cold forged heat sink immediately after removal from the moulding die and after further processing which gives the final shape.

Referring to FIG. 10, a suitably sized and shaped billet (62) made of a suitable thermally conductive material, for example, metal and preferably aluminium alloy, especially aluminium alloy 6063, is selected and placed within the cavity. At this point, the cavity on the lower mould corresponding to the shoulder portion and above of the heat sink will be occupied by the billet. The punch (4) will then be forcibly driven into the metal billet (62) until the upper mould is prevented from further advancing into the billet by the upper surfaces of the lower mould. At this point, the heat sink has been primarily formed with the neck portion formed by the escape or overflow of the billet into the narrow cavity in which the cushioning piston is positioned and by plastic deformation of the billet. It will be observed from FIG. 11 that the escape of the metal alloy will drive the cushioning piston (52) downwards and form the neck portion of the heat sink. The punched billet (61) is then removed from the lower mould by, for example, pushing the cushioning piston (52) upwards. The extra length of the metal alloy at the neck portion is then next trimmed to an appropriate length suitable for use as a heat sink (6) and sufficiently polished to ensure good thermal coupling. It will be appreciated by persons skilled in the art that a heat sink (6) with a closed bottom can only be formed by cold forging and not by extrusion.

Cold forging is preferred for the manufacturing of a heat sink because when the billet is subject to a high punching force, the metal phase of the aluminium alloy is instantly changed with increased density, thereby increasing thermal conductivity which makes this alloy particularly suitable for making heat sink. As an example to illustrate the cold forging process, the length L and size of the aluminium alloy billet can be prepared according to the following formula:

$$L = V/S,$$

where V is the volume of the billet and S being the cross-sectional area of the billet. In general, V equals $1.05 \cong 1.15$ Vo where Vo is the volume of the finished heat sink.

Because of the complexity of the shape of the present invention, it is preferred that the cold-forging is done in several steps with pre- and post-forging processes so that the punching force or pressure can be gradually increased to gradually shape the heat sink in order to achieve an even and gradual metal flow to achieve even and gradual metal deformation, fine metal surface structure as well as reduced surface defects and to minimise the separation between the main heat dissipation surfaces of the fin members. Furthermore, by the use of multi-step or progressive cold forging process described above, fins having longer length than conventional cold forged heat sinks which provide more surface area for heat exchange can be produced. Hence, with the improved design mentioned above together with the cold forging process described above, an improved heat sink having an improved heat dissipation configuration as well as improved heat dissipation efficiency as a result of the metal treatment by way of punching can be produced.

What is claim is:

1. A cold forged aluminum heat sink including a base portion, said base portion includes a first surface for thermally coupling said heat sink with an electronic device, and a second surface on which a first and a second group of heat dissipating members are integrally formed and extend upwardly therefrom; said first group of heat dissipation members includes a plurality of fin-shaped members each having main heat dissipation surfaces surrounded by thin peripheral edges including a top edge, an inside edge and an outside edge, said thin peripheral top edges generally extend from the interior of said base portion towards the outside periphery of said base portion, said main heat dissipation surfaces on adjacent heat dissipation members are substantially opposing to each other, and said second group of heat dissipation members are disposed between said first group of heat dissipation members and the center of said base portion.

2. The heat sink of claim 1 wherein said second group of heat dissipation members includes a plurality of curved fin-shaped members.

3. The heat sink according to claim 2 wherein said second group fin-shaped members includes main heat dissipation surfaces interconnected by a thin peripheral top edge, said peripheral edge extends generally from said center to the exterior of said base portion and have a thickness substantially thinner than that of said first surface said base portion.

4. The heat sink of claim 1 wherein the inside and outside thin peripheral edges of said first group heat dissipation members are respectively disposed on two concentrated circles.

5. The heat sink of claim 1 wherein the heat dissipation members of said first group are disposed in a generally annular member with the fin-shaped manner disposed in a substantially radial manner.

6. The heat sink of claim 1 wherein the outside thin edge of the first group of fin members is thinner than the inside edge of the fin members.

7. The heat sink of claim 2 wherein the curved fin-shaped members are generally disposed so that the adjacent curved fin-shaped members have generally similar curvation and length and are disposed in generally the same direction.

8. The heat sink of claim 7 wherein the ratios between the maximum height of fins in the first group of heat dissipating members to that of the second group of heat dissipating members are in a range from 2.1 to 6.7.

9. The heat sink of claim 1 wherein the second group of heat dissipating members includes fin-shaped members which are substantially shorter than the fin-shaped members of the first group of heat dissipating members and at least less than 51% shorter than the height of the first group of heat dissipating members.

10. The heat sink of claim 1 wherein at least some of the first group of heat dissipating members are fin-shaped with a zigzag outline so that the upmost end of said zigzagged member overhangs the base of said zigzag member.

11. A cold forged aluminum heat sink including a base portion, said base portion includes a neck portion and a shoulder portion, said shoulder portion abuts said neck portion and has a substantially larger cross-sectional area than said base portion wherein a plurality of heat dissipating heat members are integrally formed along the periphery of said shoulder portion so that said fin members are substantially overhanging said shoulder portion with space separating the adjacent fin members defining a plurality of cooling-air channels, said neck portion being of higher density than the shoulder portion.

12. The heat sink of claim 10 wherein said shoulder portion is adapted to extend beyond and overhang the package of an electronic device.

* * * * *

UNITED STATES PATENT AND TRADEMARK OFFICE
CERTIFICATE OF CORRECTION

PATENT NO. : 6,466,444 B2
DATED : October 15, 2002
INVENTOR(S) : Wai Kwan Cheung It is certified that error appears in the above-identified patent and that said Letters Patent is hereby corrected as shown below:

<u>Title page,</u>
Item [73], Assignee, "Yunk Woon Cheung" should read -- Yuk Woon Cheung --.

Signed and Sealed this

Nineteenth Day of August, 2003

JAMES E. ROGAN
*Director of the United States Patent and Trademark Office*